United States Patent [19]
Haas

[11] 3,784,845
[45] Jan. 8, 1974

[54] LINEAR FREQUENCY TO VOLTAGE CONVERTER CIRCUIT

[75] Inventor: George C. Haas, Phoenix, Ariz.

[73] Assignee: Sperry Rand Corporation, New York, N.Y.

[22] Filed: Feb. 6, 1973

[21] Appl. No.: 330,129

[52] U.S. Cl. .................. 307/233, 328/133
[51] Int. Cl. .................. H03k 5/20
[58] Field of Search .................. 307/233, 251, 271, 307/265, 267; 328/133–134, 15, 151

[56] References Cited

UNITED STATES PATENTS

| | | | |
|---|---|---|---|
| 3,723,891 | 3/1973 | Whiteley | 307/233 |
| 3,717,818 | 2/1973 | Herbst | 328/134 |
| 3,694,744 | 9/1972 | Kalotay | 307/233 |
| 3,582,799 | 6/1971 | Reid | 328/151 |

*Primary Examiner*—John W. Huckert
*Assistant Examiner*—R. E. Hart
*Attorney*—Howard P. Terry

[57] ABSTRACT

A device which includes a squaring amplifier responsive to an applied input frequency signal for producing constant amplitude square waves at the same frequency as the applied input signal. A switch coupled to the amplifier enables a capacitor to be rapidly charged from a reference voltage and a voltage due to an accumulated charge on a second capacitor during the first half cycle of each square wave. The charge accumulated on the first capacitor is rapidly transferred to the second capacitor during the second half cycle of each square wave through a second switch. The voltage due to the accumulated charge on the second capacitor is coupled through a long time constant discharge circuit to a buffer amplifier including a feedback ripple filter whereby the amplifier provides an output D.C. voltage which is linearly proportional to the frequency of the input signal.

6 Claims, 1 Drawing Figure

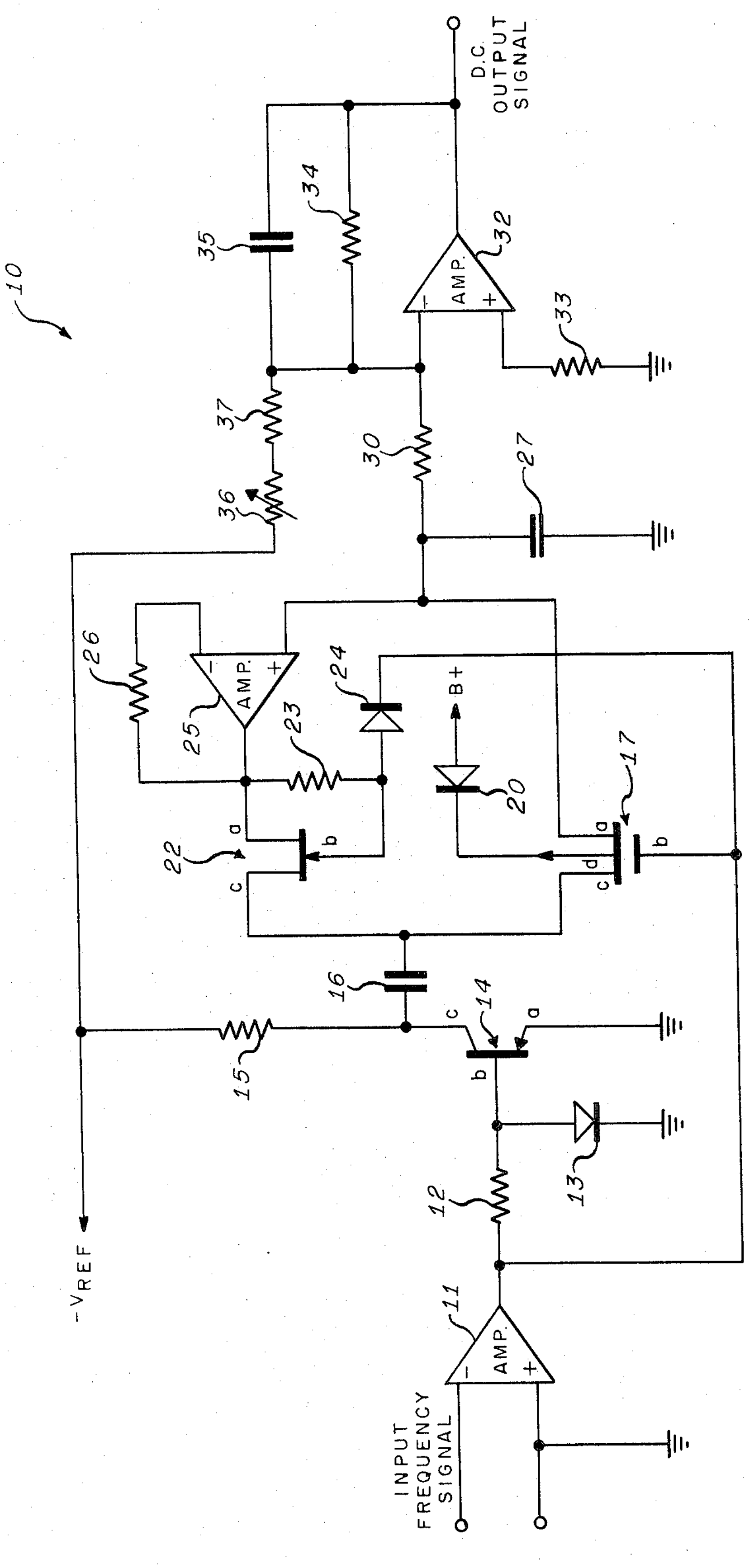
D.C. OUTPUT SIGNAL
INPUT FREQUENCY SIGNAL
-VREF
B+
AMP.
AMP.
AMP.
10
11
12
13
14
15
16
17
20
22
23
24
25
26
27
30
32
33
34
35
36
37

LINEAR FREQUENCY TO VOLTAGE CONVERTER CIRCUIT

BACKGROUND OF THE INVENTION

1. Field of the Invention

The present invention pertains to the field of electronic converter circuits and particularly to those circuits which provide an output D.C. voltage which is linearly proportional to the frequency of an applied input signal.

2. Description of the Prior Art

The prior art teaches a basic frequency to voltage converter circuit based on the principle of charge transfer between capacitors in which a square wave input of amplitude E is applied to a series circuit including a first capacitor coupled through a diode to a second capacitor. During the positive half cycles of the square wave the diode is forward biased and the potential across the first capacitor is equal to:

$$E_{c_1} = EC_2/C_1+C_2$$

and the potential across the second capacitor is equal to:

$$E_{c_2} = EC_1/C_1+C_2$$

assuming the forward conduction voltage across the diode is negligible. During the negative half cycle of the applied square wave if the applied potential is assumed to be at ground potential, a p-n-p transistor, coupled in parallel with the diode so that its base is connected to the junction of the cathode of the diode and the second capacitor and its emitter is coupled to the junction of the plate of the diode and the first capacitor, will become forward biased and the first capacitor will discharge through the transistor to a high voltage applied to its collector. The diode will be reversed biased and the first capacitor will receive a charge transfer from the second capacitor in an opposite direction to its initial charge until the potential across the first capacitor becomes equal and opposite to the potential across the second capacitor, i.e.

$$E_{c_1} = EC_1/C_1+C_2$$

assuming the conduction voltage across the transistor is negligible. This sequence will be repeated for each successive cycle and a potential equivalent to the initial potential across the second capacitor will be added to the second capacitor until a state of equilibrium is reached in which the potential across the second capacitor is equal to the maximum value of the applied square wave or until the rate of discharge from the second capacitor through an output resistance circuit equals the frequency of the applied square waves.

In actual practice this circuit has been found to be unable to meet high accuracy requirements for linearity and is also subject to instabilities due to temperature variations.

The present invention employs a variation of the charge transer principle in a circuit including a plurality of fast acting solid state switches, capacitors and resistors having specific characteristics which provide a linear frequency to D.C. conversion over a selected range of frequencies and operating temperatures.

SUMMARY OF THE INVENTION

The present invention is a converter circuit which provides an output D.C. voltage that is linearly proportional to the frequency of an applied input signal. A squaring amplifier responsive to the applied input signal saturates positively or negatively at the zero crossings of the applied input waveform thus providing an output square wave signal of constant amplitude and having zero crossings coincident with the zero crossings of the applied input signal. First and second fast acting switches coupled to the amplifier are gated off while a third fast acting switch also coupled to the amplifier is gated on by the positive going steps of the square waves.

During the positive half cycles the third switch enables a first capacitor to rapidly charge from a potential across a second capacitor which is coupled to the first capacitor through a unity gain circuit while the first switch enables the first capacitor to rapidly accumulate an additional charge from a reference potential coupled to the first capacitor through a charging resistor.

During the negative half cycles, one terminal of the first capacitor is shorted to ground through the first switch and the other terminal is coupled through the second switch to the second capacitor while the third switch interrupts the charging of the first capacitor through the unity gain circuit. As a result the additional charge accumulated on the first capacitor from the reference potential is transferred to the second capacitor thereby increasing the potential across the second capacitor. A resistor in combination with the second capacitor provides a long time constant discharge circuit which is coupled to a buffer amplifier that includes a feedback ripple filter for smoothing the variations in voltage applied to the input of the amplifier due to the charging and discharging of the second capacitor.

Since the additional accumulated charge on the first capacitor produced by the reference voltage is transferred from the first capacitor to the second capacitor for each cycle of frequency, changes in the input frequency produce changes in the rate at which the additional accumulated charge is transferred between the first and second capacitors thereby providing a voltage at the output of the long time constant circuit which has an average value that is linearly proportional to the frequency of the applied input signal.

BRIEF DESCRIPTION OF THE DRAWING

The single FIGURE is a schematic diagram of a linear frequency to voltage converter circuit incorporating the present invention.

DESCRIPTION OF THE PREFERRED EMBODIMENT

As shown in the FIGURE, a frequency to D.C. converter 10 includes an input amplifier 11 having its non-inverting input terminal (+) coupled to ground potential. An input frequency signal is applied between the inverting input terminal (+) and the non-inverting input terminal (−) on the amplifier 11. Typically the amplifier 11 is known in the art as a squaring amplifier which saturates positively and negatively at the zero crossings of the input frequency signals thus producing a square wave output signal of constant amplitude having zero crossings coincident with the zero crossings of the input frequency signals irrespective of the particular wave shape of the input signal. The output of the amplifier 11 is coupled through an input circuit including a series resistor 12 and a limiting diode 13 to the base *b* of a p-n-p switching transistor 14. The emitter terminal a of the switching transistor 14 is connected to ground and the collector terminal *c* is connected to the junction of a charging resistor 15 and a capacitor 16. The other terminal of the resistor 15 is connected to a voltage reference source $-V_{ref}$. The output terminal of the squaring amplifier 11 is also connected to the gate *b* of an insulated gate field effect transistor (IGFET) 17 such as a metal oxite silicon field effect transistor (MOSFET) which functions as a second solid state switch. The IGFET 17 has its source terminal *c* connected to the second terminal on the capacitor 16 and its drain terminal connected to the non-inverting input terminal on a voltage follower 25. The fourth terminal on the IGFET 17 is a connection to the substrate of the IGFET 17 and the arrow indicates the polarity of the device as a p-channel device. The substrate terminal *d* is connected to the cathode of a blocking diode 20 which has its anode connected to a source of positive potential B+.

A third solid state switch 22 which is typically a junction field effect transistor (JFET) has its gate terminal *b* also coupled to the output of the squaring amplifier 11 through a blocking diode 24 which has its cathode connected to the output terminal of the squaring amplifier and its anode connected to the gate terminal *b*. A resistor 23 is connected between the source terminal a and the gate terminal *b* of the JFET 22 in order to discharge the interelectrode capacitances in the JFET 22 thereby decreasing the time required for the JFET 22 to turn on.

A feedback resistor 26 is coupled between the output terminal and the inverting input terminal (−) of the voltage follower 25 to provide unity gain between the non-inverting input terminal (+) of the voltage follower 25 and the source terminal a of the JFET 22.

A second capacitor 27 has one terminal connected to ground and its other terminal connected to the junction of the drain terminal a of MOSFET 17 and the non-inverting terminal (+) of the voltage follower 25. A resistor 30 has one terminal connected to the second terminal on the capacitor 27 and combines therewith to provide a long time constant integrating filter.

The second terminal of the resistor 30 is connected to the inverting terminal (−) of an output buffer amplifier 32 which has its non-inverting terminal (+) coupled through a resistor 33 to ground potential. A cascaded filter comprised of a resistor 34 and capacitor 35 connected in parallel between the output terminal and inverting input terminal (−) of the buffer amplifier 32 provides smoothing of the integrated voltage applied to the inverting terminal (−) of the buffer amplifier 32 from the integrating filter, capacitor 27 and resistor 30.

A series circuit comprised of a variable or selected resistor 36 and a fixed resistor 37 is coupled between the voltage reference source $-V_{ref}$ and the inverting terminal (−) of the buffer amplifier 32. This resistance circuit provides an adjustable offset voltage that may be employed to compensate the output of buffer amplifier 32 to zero or other desired voltage at a desired input frequency.

In operation an input frequency signal is applied across the inverting (−) and non-inverting (+) terminals of the amplifier 11 which produces a constant amplitude square wave output signal of a frequency corresponding to the frequency of the input signal. During the positive half cycles of the square waves the solid state switches 14 and 17 are gated off and the solid state switch 22 is gated on. The capacitor 16 accumulates a quantity of charge from the reference voltage source $-V_{ref}$ through the charging resistor 15 and also accumulates an additional charge through the conducting switch 22 and voltage follower 25 in accordance with the potential across the capacitor 27 produced by any previously accumulated charge on the capacitor 27. The charging time constants for the two circuits coupled to the capacitor 16 are very short in comparison to the discharging time constant of the integrating filter comprised of the resistor 32 and the capacitor 31.

When the potential applied to the terminal of the capacitor 16 that is coupled to the JFET switch 22 is equal to the potential on the capacitor 27, the JFET switch 22 ceases conduction. An important feature of the JFET switch 22 during this interval is that it has a low value of resistance to allow the capacitor 16 to charge very rapidly. The other terminal to capacitor 16 is simultaneously charged until the potential applied thereto is equal to $-V_{ref}$. Thus the total charge accumulated on the capacitor 16 during a positive half cycle of a square wave is proportional to the accumulated charge on capacitor 27 and the potential $-V_{ref}$.

As the output square wave from the amplifier 11 goes from the positive value to a negative value the p-n-p transistor switch 14 will be gated on, coupling the junction of the charging resistor 15 and the capacitor 16 to ground potential. The MOSFET switch 17 will also be gated on, coupling the other terminal of the capacitor 16 to the capacitor 27 and the JFET switch 22 will be held off by the reverse bias applied to the diode 24, thereby inhibiting further charging of the capacitor 16 through the voltage follower 25. The p-n-p transistor switch 14 must have a low value of resistance during conduction, otherwise it will degrade the transfer of charge from the capacitor 16 to the capacitor 27 during the positive half cycle of the square wave. It should also have a very short switching time and a low off-set voltage. A typical value of off-set voltage in p-n-p switching transistors is in the range of 30 to 50 millivolts which would be considered an order of magnitude greater than that required for most applications of the present converter circuit. In one embodiment of the subject invention the selected p-n-p switching transistor was a 2N2945 which has an off-set voltage of less than 1 millivolt. This characteristic contributes to the precision of the frequency to D.C. conversion because a higher value of off-set voltage would produce an off-set error in the output voltage. The MOSFET switch 17 in addition to having a very short switching time must also have a low threshold turn-on voltage that is well within the range of the amplitude of the square waves from the amplifier 11.

The capacitor 16 must have a value of capacity that remains substantially constant, which requires that it possess a minimal value of temperature co-efficient. A porcelain capacitor has been found to possess this desired characteristic along with a very high insulation resistance. The capacitor 27 must also have a very high insulation resistance because any leakage that occurs in parallel with either capacitor will cause an error in the output voltage. Although the capacitor 27 is much less critical with respect to temperature variations, any changes in leakage in the capacitor 27 will degrade the resistance value of the resistor 30 and directly effect the output D.C. voltage.

Connecting the junction of the resistor 15 and the capacitor 16 to ground potential through the transistor switch 14 raises the potential across the capacitor 16 to a value greater than that across the capacitor 27 with respect to ground potential. As a result the capacitor 16 acts as a potential source and transfers a constant value of differential charge through the MOSFET switch 17 into the capacitor 27, which charges very rapidly to a corresponding potential. Since the integrating filter comprised of the resistor 30 and the capacitor 27 has a long discharge time constant, the potential on the capacitor 27 will decrease at a much slower rate in comparison to the rate at which the charge is transferred to the capacitor 27 from the capacitor 16. Furthermore as the frequency of the applied input signal increases, the frequency of the square wave increases which produces an increase in the rate at which charge is transferred from the capacitor 16 to the capacitor 27. Therefore, the average potential on the capacitor 27 will be a linear function of the rate at which charge is transferred from the capacitor 16 and effectively linearly proportional to the frequency of the applied input signal.

The buffer amplifier 32 and the feedback cascaded filter comprised of the resistor 34 and the capacitor 35 combine to smooth out the ripple voltage at the input of the amplifier 32 which is due to the charging and discharging of the capacitor 27 and provides a substantially ripple free D.C. output voltage.

In some applications of the linear frequency to D.C. converter circuit such as in an air data computer of the type disclosed in applicant's assignee's co-pending U.S. Pat. application Ser. No. 330,164, filed concurrently herewith in the names of Pierce C. Roselle, David G. Evans and Vaugh R. Bussma, entitled "Air Data Computer Including D.C. To Synchro Signal Converter," the applied input signal has a given input frequency at a position such as sea level which is desired to be a reference position. A zero output voltage is obtained at sea level by adding the resistors 36 and 37 between $-V_{ref}$ and the inverting input terminal (−) of the buffer amplifier 32. The variable resistor 36 provides sufficient adjustment to obtain a null-voltage output over the expected frequency ranges at sea levels.

The output voltage can be determined from the following equation:

$$E_0 = -V_{ref}\, C_1\, R f_{in}$$

in which $-V_{ref}$ is the reference potential in volts, $C_1$ is the capacity of the capacitor 16 in farads, R is the resistance of the resistor 30 in ohms and $f_{in}$ is the frequency of the applied input signal in hertz. In a specific embodiment of the invention the input frequency at sea level was 3kHz. The referenced potential was 10 volts, the capacitor 16 was $5 \times 10^{-9}$ farads and the resistor 30 had a value of $1.5 \times 10^5$ ohms. Thus the output voltage at sea level was:

$$E_0 = 10 \times 5 \times 10^{-9} \times 1.5 \times 10^5 \times 3 \times 10^3 = 22.5 \text{ volts}$$

By adjusting the value of the resistor 36 which is coupled between the reference potential $-V_{ref}$ and the inverting terminal (−) input of the buffer amplifier 32, 22.5 volts is effectively subtracted from the input voltage giving a zero reference output voltage at sea level.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A converter circuit for providing an output D.C. voltage which is linearly proportional to the frequency of an applied input signal comprising an amplifier responsive to said applied input signal for providing square waves of constant amplitude at the same frequency as said applied input signal, first switching means coupled to said amplifier and responsive to said square waves, a source of reference potential, first capacitor means coupled to said reference potential and said first switching means whereby said first switching means alternately couples a terminal of said capacitor means between said reference potential and ground potential during successive half cycles of each square wave, second and third switching means synchronously operable with said first switching means and coupled to said amplifier and said first capacitor means, second capacitor means coupled to said second and third switching means whereby said second capacitor means alternately applies an accumulated potential through said third switching means to said first capacitor means and receives a constant value of differential charge from said first capacitor means through said second switching means during successive half cycles respectively of each square wave, and resistor means coupled to said second capacitor means forming a long time constant discharging circuit for providing an output D.C. voltage having an average value which is linearly proportional to said frequency of said applied input signal.

2. A converter circuit as recited in claim 1 which further includes a buffer amplifier and cascaded filter coupled to said resistor means for reducing ripple in said output D.C. voltage due to said charging and discharging of said second capacitor means.

3. A converter circuit as recited in claim 2 which further includes a variable resistance circuit coupled between said source of reference potential and said resistor means for providing an adjustable output D.C. voltage which may be set to a desired reference level corresponding to a selected frequency of said applied input signal.

4. A converter circuit as recited in claim 1 in which said first switching means includes a solid state switch having a short switching time, a low value of resistance during conduction and a low off-set voltage.

5. A converter circuit as recited in claim 1 in which said first capacitor means includes a capacitor having a minimal value of temperature co-efficient and a very high insulation resistance whereby said capacitor maintains a substantially constant value of capacity and a minimal amount of leakage thereby enabling said first capacitor means to transfer a constant value of differential charge to said second capacitor means.

6. A converter circuit as recited in claim 1 in which said third switching means includes a solid state switch having a very short switching time and a low value of resistance during conduction which forms a short time constant charging circuit into said first capacitor means for charges produced by said accumulated potential applied from said second capacitor means.

* * * * *